(12) United States Patent
Abdulky

(10) Patent No.: US 6,667,630 B2
(45) Date of Patent: Dec. 23, 2003

(54) UNIVERSAL FLYING PROBE FIXTURE

(76) Inventor: Obaida A. Abdulky, 43 Monroe Ave., Worcester, MA (US) 01602

( * ) Notice: Subject to any disclaimer, the term of this patent is extended or adjusted under 35 U.S.C. 154(b) by 0 days.

(21) Appl. No.: 10/205,171

(22) Filed: Jul. 25, 2002

(65) Prior Publication Data

US 2003/0020504 A1 Jan. 30, 2003

Related U.S. Application Data

(60) Provisional application No. 60/308,015, filed on Jul. 26, 2001.

(51) Int. Cl.$^7$ ............................................... G01R 31/02
(52) U.S. Cl. ...................................................... 324/755
(58) Field of Search ................................ 324/755, 754, 324/763, 158.1, 756, 757, 758, 695, 715; 356/237.5, 614, 394, 237.1, 622; 250/559; 348/125, 126

(56) References Cited

U.S. PATENT DOCUMENTS

| | | | |
|---|---|---|---|
| 4,116,376 A | * | 9/1978 | Delorme et al. ............ 228/170 |
| 4,832,250 A | * | 5/1989 | Spigarelli et al. ............ 228/102 |
| 6,362,877 B1 | * | 3/2002 | Kobayashi et al. ......... 356/237 |

* cited by examiner

*Primary Examiner*—Kamand Cuneo
*Assistant Examiner*—Trung Nguyen
(74) *Attorney, Agent, or Firm*—Brian M. Dingman, Esq.; Mirick, O'Connell, DeMallie & Lougee, LLP

(57) ABSTRACT

A universal printed circuit board fixture for a flying probe test machine that has opposed clamps, comprising a pair of members, at least one such member being movable relative to the other member, the members defining protruding portions that are adapted to be held in the opposed clamps of a flying probe test machine, and one or more engagement structures carried by each member, each such engagement structure adapted to be coupled to a portion of a printed circuit board. One or more of such engagement structures are adjustable along the length of a member, to allow the accommodation of boards of different size and shape.

11 Claims, 5 Drawing Sheets

UNIVERSAL FLYING PROBE FIXTURE

CROSS REFERENCE TO RELATED APPLICATION

This application claims priority of Provisional application serial No. 60/308,015, filed on Jul. 26, 2001.

FIELD OF THE INVENTION

This invention is a fixture for holding circuit boards to be tested in a flying probe circuit board test device.

BACKGROUND OF THE INVENTION

Existing flying probe circuit board test devices use pneumatic clamps that are designed to clamp rails along the edges of circuit boards that are generally rectangular, or at least have parallel rails along substantially all of two sides of the circuit board. However, many circuit boards do not have such configuration and so cannot be rigidly held in the clamps, or they have components that are close enough to one or both edges such that they interfere with the operation of the clamps.

SUMMARY OF THE INVENTION

The inventive fixture is designed to alleviate these problems.

This invention is a fixture for holding circuit boards to be tested in a flying probe printed circuit board test device. The fixture allows the test device to be used to test different shaped and sized circuit boards, and ones with unusual component layout restrictions.

The inventive fixture is designed to be securely held in the pneumatic clamps of the existing test machines, and includes mechanical devices that are fully adjustable to accommodate virtually any size and shape circuit boards. The inventive device is coupled to the board by the board edges or using the board's registration holes.

This invention features a universal printed circuit board fixture for a flying probe test machine that has opposed clamps, comprising a pair of members, at least one such member being movable relative to the other member, the members defining protruding portions that are adapted to be held in the opposed clamps of a flying probe test machine, and one or more engagement structures carried by each member, each such engagement structure defining an upwardly protruding pin adapted to pass through a registration hole of a printed circuit board. One or more of such engagement structures are adjustable along the length of a member, to allow the accommodation of boards of different size and shape with different locations of the registration holes.

The protruding portions of the members are preferably at the ends of the members. The fixture may further comprise means for firmly holding the engagement structures relative to the member on which they are carried. The means for firmly holding may comprise a screw and a tapped hole.

The members are preferably essentially parallel to one another. The fixture preferably further comprises a seat carried by each pin, to hold a circuit board. The seat may hold the circuit board at substantially the same height as the protruding portions.

One member may be fixed and the other may slide on a pair of rails. There are preferably two engagement structures carried by each member. The engagement structures may each define a slot that allows for adjustment of the position of the engagement structure along the length of the member.

In a more specific embodiment, the invention features a universal printed circuit board fixture for a flying probe test machine that has opposed clamps, comprising a pair of essentially parallel members wherein one member is fixed and the other slides on a pair of rails, at least one such member being movable relative to the other member, the members defining protruding portions at their ends that are adapted to be held in the opposed clamps of a flying probe test machine, at least two engagement structures carried by each member, each such engagement structure defining an upwardly protruding pin adapted to pass through a registration hole of a printed circuit board, and means for firmly holding the engagement structures relative to the member on which they are carried. One or more of such engagement structures are adjustable along the length of a member, to allow the accommodation of boards of different size and shape with different locations of the registration holes.

In this embodiment, as in the other embodiment, the engagement structures may each define a slot that allows for adjustment of the position of the engagement structure along the length of the member. The means for firmly holding may comprise a screw and a tapped hole. The fixture may further comprise a seat carried by each pin, to hold a circuit board. The seat preferably holds the circuit board at substantially the same height as the protruding portions.

BRIEF DESCRIPTION OF THE DRAWINGS

Other objects, features and advantages will occur to those skilled in the art from the following description of the preferred embodiment and the accompanying drawings, in which.

DESCRIPTION OF THE PREFERRED EMBODIMENT

This invention may be accomplished in a fixture for holding circuit boards to be tested in a flying probe circuit board test device, such as Genrad's GR Pilot and devices from Takaya and SEICA. The fixture allows the test device to be used to test different shaped and sized circuit boards and ones with unusual component layout restrictions.

Figure 1:
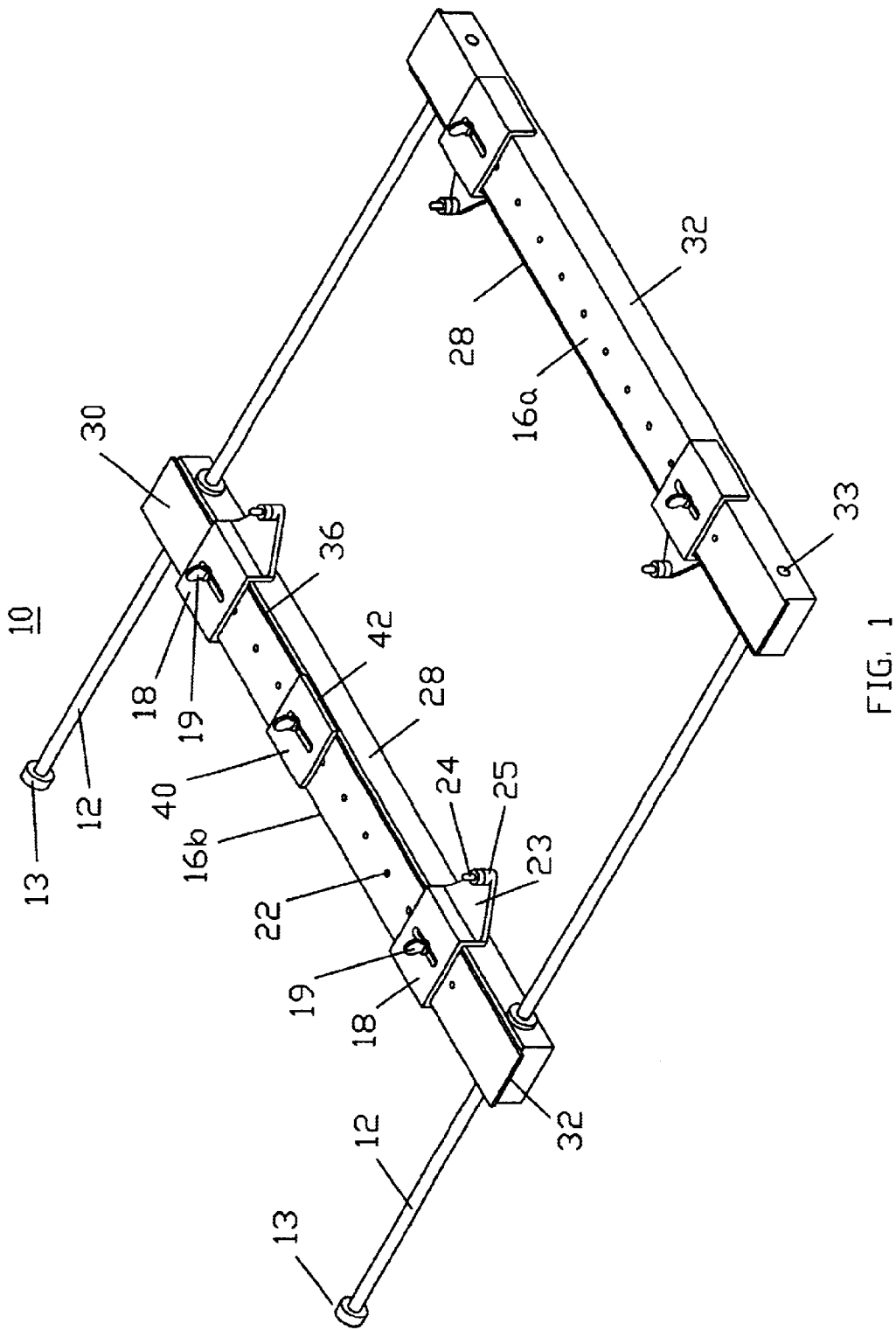
FIG. 1 is a perspective view of the preferred embodiment of the fixture of this invention.
Figure 2:
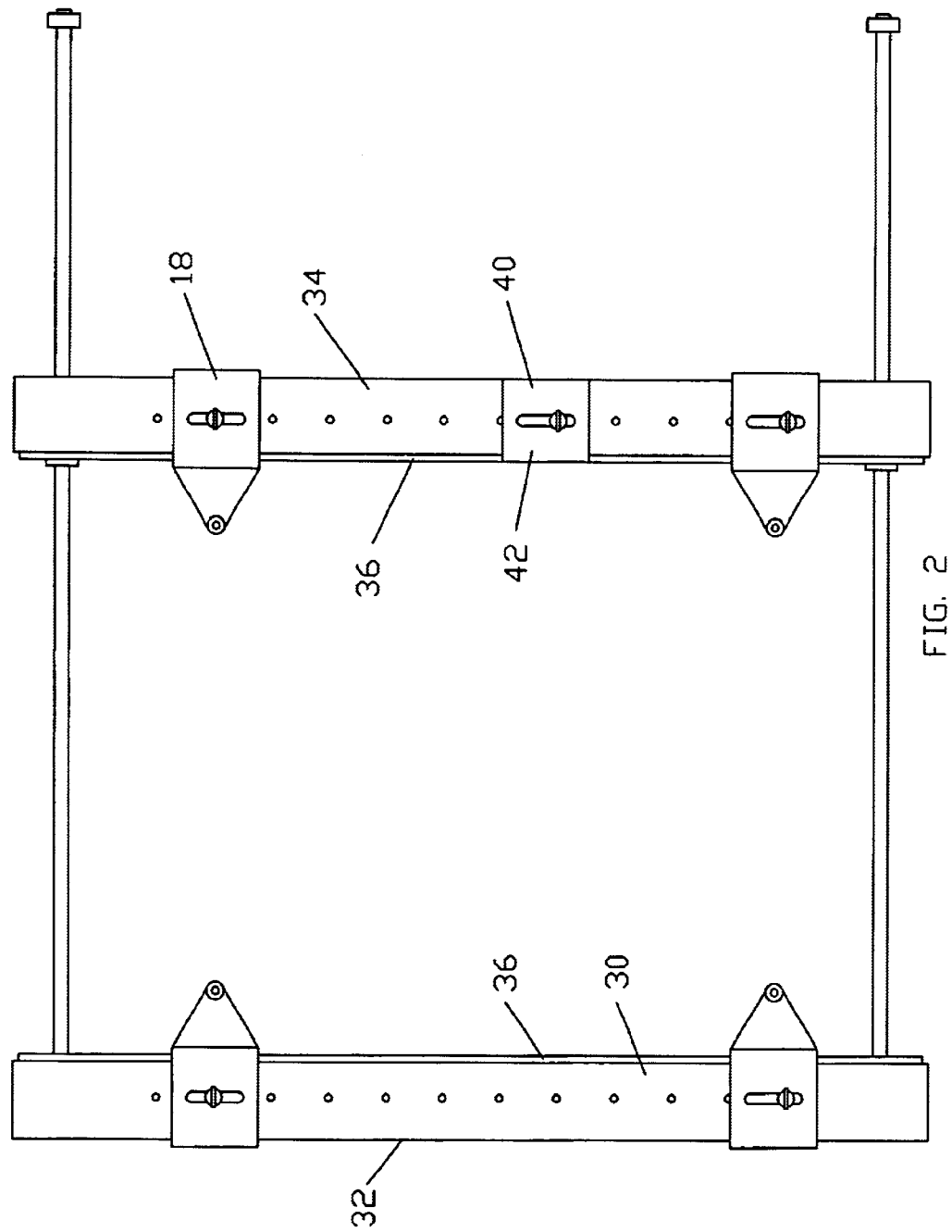
FIG. 2 is a top view of the fixture of FIG. 1.
Figure 3:
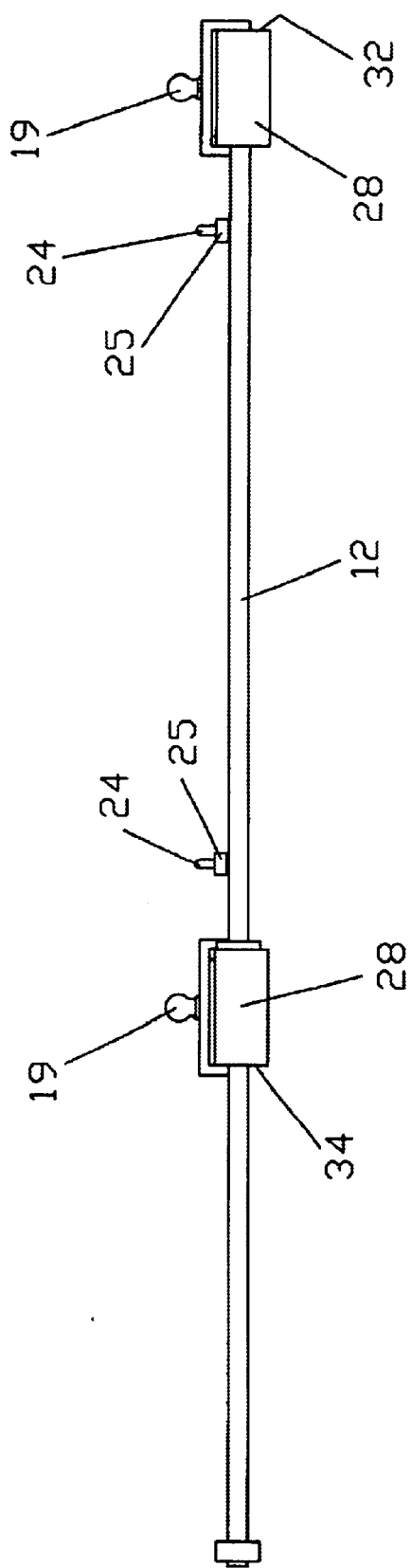
FIG. 3 is a side view of the fixture of FIG. 1.
Figure 4:
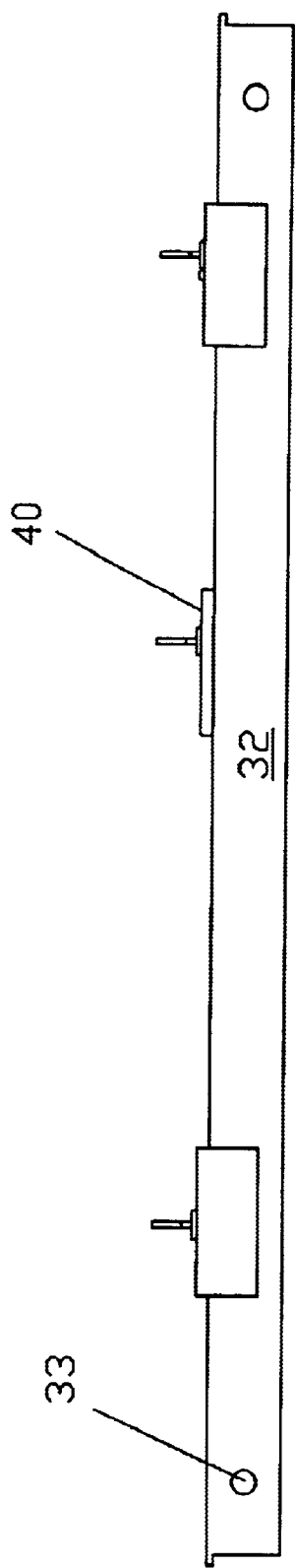
FIG. 4 is one end view.
Figure 5:
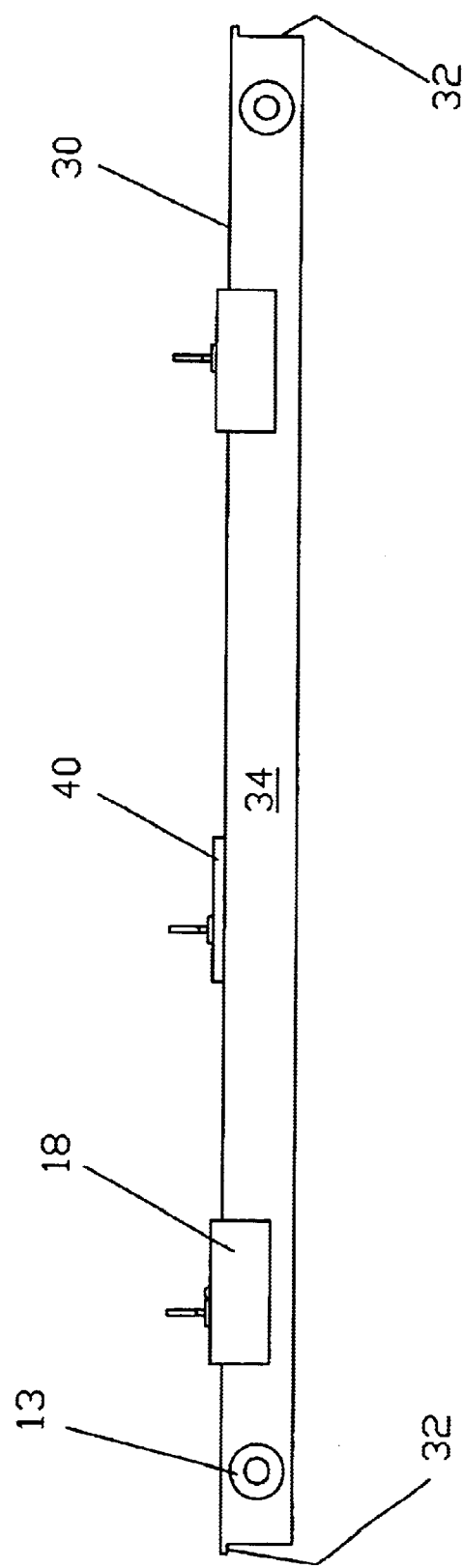
FIG. 5 is the other end view, of the fixture of FIG. 1.

The preferred embodiment is shown in the attached FIGS. 1–5. Inventive fixture 10 comprises rods or rails 12 to which are fixed at one end, one member 16a, with the other member 16b slidable along the lengths of rods 12, to distal end stop members 13. Members 16 comprise base portions 28 that accept rods 12, and upper surface portions 30 that overlap each end of portion 28, to create overhangs 32, as best seen in FIG. 5. These overhangs 32 have the thickness of a typical circuit board. Overhangs 32 thus present the equivalent of spaced portions of the parallel side rails found along two opposed edges of rectangular circuit boards. Overhangs 32 thus can be held within the pneumatic clamps of the test device.

Fixture 10 can carry four board holding members 18, each of which can be moved along the length of one of members 28 by the use of slots in members 18 and thumb screws 19 that fit within tapped holes 22. Members 18 carry lowered portions 23 which have at their distal ends upwardly protruding post 24 and cushioning plastic pads 25 thereon.

Portions 23 are designed such that the upper surfaces of cushioning pads 25 lie at the same height as shelf 36 in members 28. The board to be tested is placed such that its four registration holes fit over the four protruding posts 24, although obviously less than four registration openings can be accommodated with the inventive fixture. The height arrangement of pads 25 holds the top of the board at the same height as top 30 of portions 32 of members 28, which are themselves held in the clamps of the test machine. The result is that the board to be tested is held by the inventive fixture at the same horizontal (height) location as it would have if it was directly clamped into the clamps of the test device. Thus, the inventive fixture can be used in these test devices without any modification of the flying and/or fixed probes that are used in the test device to test the printed circuit board.

An alternative means of coupling a board to the inventive fixture involves using a number of sandwiching board clamps 40 rather than members 18. Two parallel edges of a board are placed on shelves 36. Overhanging portions 42 of two or more clamps 40 are placed over the board, and the thumbscrews are tightened. This allows boards without registration holes to be tested.

The inventive fixture also provides absolute registration of boards once the fixture is clamped into the test machine. This obviates the need to register each board after it is placed in the machine, and recompute the test coordinates, as occurs in existing systems. Accordingly, the test device not only allows the testing of virtually any shape and sized board, but also speeds the testing.

Other embodiments will occur to those skilled in the art, and are within the scope of the following claims.

What is claimed is:

1. A universal printed circuit board fixture for a flying probe test machine that has opposed clamps that are adapted to hold a printed circuit board, the universal printed circuit board fixture comprising:

a pair of elongated, essentially parallel members defining elongated facing edges, each member comprising a base portion and a thin, flat upper surface portion that extends beyond the base portion, wherein the upper surface portions of a member both lie in the same plane;

a pair of spaced rails with which the base portions of the members are engaged;

wherein at least one of the members is movable along the rails, so that the members are movable relative to one another to alter the distance between the facing edges of the members, to accommodate different size printed circuit boards for testing; and wherein the base portions of the members each extend beyond the rails, and the upper surface portions of the members define thin protruding overhangs that extend slightly beyond the base portions of the members outside of the rails and that are in the same plane, so that the overhangs present the outermost portions of the members that can be held in the opposed clamps of a flying probe test machine, to thereby hold each member at its ends in the clamps of a flying probe test machine; and two printed circuit board holding mechanical structures carried by each member, each such printed circuit board holding mechanical structure comprising means for engaging a portion of a circuit board;

wherein one or more of such printed circuit board holding mechanical structures are movable along the length of a member, to allow the accommodation of boards of different size and shape.

2. The fixture of claim 1, further comprising means for firmly holding the printed circuit board holding mechanical structures relative to the member on which they are carried.

3. The fixture of claim 2, wherein the means for firmly holding comprises a screw and a tapped hole.

4. The fixture of claim 1, wherein the printed circuit board holding mechanical structures define an upwardly protruding pin adapted to pass through a hole of the printed circuit board, and further comprising a seat carried by each pin, to hold a circuit board.

5. The fixture of claim 4, wherein the seat holds the circuit board at substantially the same height as the protruding overhangs.

6. The fixture of claim 1, wherein one member is fixed to the pair of rails, and the other member slides on the pair of rails.

7. The fixture of claim 1, wherein the printed circuit board holding mechanical structures each define a slot that allows for adjustment of its position along the length of the member.

8. The fixture of claim 1 wherein the printed circuit board holding mechanical structures each comprise a clamp carried by a member and extending in from the member toward the other member, so that the clamps can overly a printed circuit board engaged with the members.

9. The fixture of claim 8 wherein the facing edges of the members each define a shelf on which a printed circuit board edge can rest, wherein the clamps extend over the shelves, to hold the circuit board from above, on the shelves.

10. The fixture of claim 9 further comprising means for firmly holding the clamps relative to the member on which they are carried.

11. The fixture of claim 10 wherein the means for firmly holding comprises a screw and a tapped hole.

* * * * *